United States Patent
Albrecht et al.

(10) Patent No.: US 6,725,071 B2
(45) Date of Patent: Apr. 20, 2004

(54) FULLY TRANSPOSED HIGH TC COMPOSITE SUPERCONDUCTOR, METHOD FOR PRODUCING THE SAME AND ITS USE

(75) Inventors: Cord Albrecht, Erlangen (DE); Peter Kummeth, Herzogenaurach (DE); Peter Massek, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 42 days.

(21) Appl. No.: 10/203,811

(22) PCT Filed: Jan. 23, 2001

(86) PCT No.: PCT/DE01/00263
§ 371 (c)(1),
(2), (4) Date: Aug. 14, 2002

(87) PCT Pub. No.: WO01/59909
PCT Pub. Date: Aug. 16, 2001

(65) Prior Publication Data
US 2003/0024818 A1 Feb. 6, 2003

(30) Foreign Application Priority Data
Feb. 14, 2000 (DE) .......................... 100 06 473

(51) Int. Cl.[7] .......................... H01B 12/00; H01F 6/00; H01L 39/00
(52) U.S. Cl. .......................... 505/231; 505/704; 428/930
(58) Field of Search ................ 428/699, 701, 428/702, 930; 174/125.1; 505/230, 231, 232, 236, 704

(56) References Cited

U.S. PATENT DOCUMENTS

| | | |
|---|---|---|
| 4,611,390 A | 9/1986 | Tanaka et al. |
| 4,970,197 A * | 11/1990 | Shiota et al. ............ 505/230 |
| 5,089,455 A * | 2/1992 | Ketcham et al. ............ 501/104 |
| 5,145,832 A * | 9/1992 | Harshavardhan et al. ... 505/237 |
| 5,196,399 A * | 3/1993 | Shiota et al. ............ 65/443 |

(List continued on next page.)

FOREIGN PATENT DOCUMENTS

| | | |
|---|---|---|
| DE | 277012 | 7/1914 |
| DE | 447741 | 7/1927 |
| DE | 740651 | 10/1943 |

(List continued on next page.)

OTHER PUBLICATIONS

B. Fisher, S. Kautz, M. Leghissa, and H.–W. Neumüer; "Fabrication and Properties of Bi–2223 Tapes"; IEEE Transactions on Applied Superconductivity, vol. 9, No. 2, Jun. 1999, pp. 2480–2485.

M. Iwakuma, Kfunaki, H. Shinohara, M. Takeo, K. Yamafuji, M. Konno, Y. Kasagawa, K. Okubo, I. Itoh, S. Nose, M. Ueyama, K. Hayashi and K. Sato; "Electromagnetic Properties in Parallel Conductors Composed of Bi2223 Multifilamentary Wires for Power Transformer Wingdings"; IEEE, vol. 7, No. 2, Jun. 1997; pp. 298–301.

(List continued on next page.)

Primary Examiner—Thomas Dunn
Assistant Examiner—Colleen P. Cooke
(74) Attorney, Agent, or Firm—Harness, Dickey & Pierce, P.L.C.

(57) ABSTRACT

A fully transposed composite superconductor can be especially used for AD devices and contains subconductors composed according to the Roebel bar principle and containing $T_C$ superconducting material. Superconductors are provided, that can be laterally bent in the plain of their width B so that the bending radius R is more than 100 times the width B and the bending zone length Hsue et al. '352 publication is more than 20 times the width B. The device for producing the conductor includes devices disposed in series for combining, bending, assembling to a Roebel bar, and fixating the subcontractors.

17 Claims, 3 Drawing Sheets

U.S. PATENT DOCUMENTS

| | | | | |
|---|---|---|---|---|
| 5,531,015 | A | * | 7/1996 | Manlief et al. ................ 29/599 |
| 5,814,262 | A | * | 9/1998 | Ketcham et al. ............ 264/316 |
| 6,247,225 | B1 | * | 6/2001 | Snitchler et al. .............. 29/599 |
| 6,284,979 | B1 | * | 9/2001 | Malozemoff et al. .... 174/125.1 |
| 6,556,012 | B2 | * | 4/2003 | Yamashita .................. 324/318 |
| 6,603,379 | B1 | * | 8/2003 | Manlief et al. ............. 335/216 |

FOREIGN PATENT DOCUMENTS

| | | |
|---|---|---|
| DE | 2736157 | 2/1979 |
| DE | 3823938 | 2/1990 |
| EP | 0407709 | 1/1991 |
| EP | 0623937 | 5/1994 |
| GB | 1572236 | 5/1978 |
| GB | 2217904 | 3/1989 |
| WO | 96/39705 | 12/1996 |

OTHER PUBLICATIONS

J.D. Adams, D. Leroy, L. R. Oberli, D. Richter, M. N. Wilson, R. Wolf, H. Higley, A.D. McInturff, R. M. Scanlan, A. Nuhuis, H. H. J. Ten Kate and S. Wessel; "Rutherford Cables with Anisotropic Transverse Resistance"; IEEE, vol. 7, No. 2, Jun. 1997; pp. 958–961.

Martin N. Wilson; "Superconductivity and Accelerators: the Good Companions"; IEEE, vol. 9, No. 2, Jun. 1999; pp. 111–121.

* cited by examiner

FULLY TRANSPOSED HIGH TC COMPOSITE SUPERCONDUCTOR, METHOD FOR PRODUCING THE SAME AND ITS USE

This application is the national phase under 35 U.S.C. §371 of PCT International Application No. PCT/DE01/00263 which has an International filing date of Jan. 23, 2001, which designated the United States of America and which claims priority on German Patent Application No. 100 06 473.6 filed Feb. 14, 2000, the entire contents of which are hereby incorporated by reference.

FIELD OF THE INVENTION

The invention generally relates to a fully transposed composite superconductor having an at least approximately rectangular cross section. Preferably, it relates to one which contains a number of conductor elements which are combined in the form of a transposed conductor, and which each have

- an at least approximately rectangular cross section with a width B,
- at least one conductor core composed of a high $T_c$ superconductor material in a matrix and/or sheath composed of normally conductive material, as well as
- with respect to lateral bending in the plane of the width B, a predetermined bending radius and a predetermined bending zone length.

The invention also generally relates to an apparatus for production of this composite superconductor, and for its use.

BACKGROUND OF THE INVENTION

A composite superconductor is disclosed in "IEEE Transactions on Applied Superconductivity", Vol. 9, No. 2, June 1999, pages 111 to 121.

A power application for high $T_c$ superconductors (referred to for short as HTS conductors in the following text), for example in order to produce transformer or machine winding, requires low-loss conductors with alternating current rated values to the kilo-ampere range. However, all that is available at the moment is HTS ribbon conductors with a small cross section and with current carrying capacity values from about 50 to 100 $A_{rms}$ and 77 K in their own magnetic field. Furthermore, these ribbon conductors are mechanically highly sensitive, and their electrical characteristics depend to a major extent on the magnitude and direction of the local magnetic field in which they are located.

For these reasons, it is necessary to construct high-current superconductors, which can be used for technical purposes, from a large number of individual parallel ribbon conductors in the form of so-called composite conductors, for example according to DE 27 36 157 B2, which is based on a ready-for-use configuration that is continuous as possible. For alternating-current applications at industrial frequencies (in general up to 60 Hz), the ribbon conductors, which are referred to as conductor elements or individual conductors in the following text, of such composite conductors must also be insulated from one another and must be systematically transposed or twisted, in order to ensure that the current is distributed uniformly throughout the entire cross section, and hence to ensure that the alternating current losses are low.

Transparent composite conductors with a high alternating-current carrying capacity are in principle known. These may be configured as follows:

- as so-called "conductor bars", for example in the form of transposed conductor bars, with conductor elements composed of copper, for example of large alternating current machines.
- as so-called "twisting conductors" with conductor elements composed of copper or transformers or inductors,
- as so-called transposed "flat or round conductors" with conductor elements composed of metallic superconductors such as NbTi in Cu (see the cited DE 27 36 157 B2).

It is also known for HTS conductors to be transposed in order to increase the alternating current carrying capacity. Specific design analyses and design information relating to this relate

- to a continuous transposition of round or virtually round HTS conductor elements in single or multiple cables (see, for example, the so-called "Rutherford Cable" in "IEEE Transactions on Applied Superconductivity", Vol. 7, No. 2, June 1997, Pages 958 to 961),
- to achieving a continuous transposition effect in power cables by variation of the pitch of twisted HTS conductor elements, which are in the form of ribbons, from on conductor layer to the next conductor layer (so-called "Pitch Adjustment"; see WO 96/39705),
- so-called "in-situ" transposition, that is to say the step-by-step transposition during the production of the winding directly on the winding former, for example for a transformer winding (see, for example, "IEEE Transactions on Applied Superconductivity", Vol. 7, No. 2, June 1997, Pages 298 to 301).

The fundamental structure of a fully transposed composite superconductor composed of HTS conductor elements in the form of a transposed conductor bar is disclosed in the initially cited reference from "IEEE Transactions on Applied Superconductivity". The described composite superconductor is in this case composed of conductor elements based on concepts such as those implemented with conductor elements composed of traditional superconductor materials such as NbTi. However, it has been found that only a relatively low current carrying capacity can be achieved for the overall composite conductor with a design such as this.

SUMMARY OF THE INVENTION

An object of an embodiment of the present invention is to refine the composite superconductor having the features mentioned initially, such that it has a better current carrying capacity than this prior art. In this case, one aim is to optimally make use of the original current carrying capacity of its individual conductor elements, which are in the form of ribbons, and to minimize the risks resulting from the mechanical sensitivity and the electrical anisotropy of the conductor elements. It is intended to be able to produce the composite superconductor in virtually any desired length.

According to an embodiment of the invention, an object may be achieved by a bending radius R of greater than 100 times the width B and a bending zone length H of greater than 20 times the width B being provided for each of the conductor elements and by providing ways of fixing the conductor elements to one another.

The measures according to an embodiment of the invention are based on the idea that when a composite superconductor is constructed in the manner of a transposed conductor bar from a number of fully transposed HTS ribbon conductors, which are fully insulated from one another, as conductor elements, the necessary bends, on-end bends and flat bends of the conductor elements must not have radii that are less than critical bending radius values. It has been found that the simultaneous choice of the bending radius and of the bending zone length according to an embodiment of the invention as a function of the conductor element width avoids damage to the superconducting conductor cores of the conducting elements during bending in order to form the transposed conductor bar structure, that is to say during the so-called "transposition process".

In this case, with the choice of the abovementioned two variables according to an embodiment of the invention, the bending radii for the bending which is required for the transposition process can even be complied with without any problems around the flat faces, and are in the order of normal orders of magnitude. Each conductor element can thus then advantageously contribute to major extent additively to the current carrying capacity of the overall composite superconductor. Since the bending zone length H is considerably greater than in the case of a structure which is known from traditional superconductors is based on the cited prior art, this results in relatively loose composite assembly, which necessitates fixing devices for fixing the conductor elements to one another, and hence for fixing the entire composite conductor. These fixing devices can be chosen with regard to further processing of the composite superconductor.

Composite superconductors according to an embodiment of the invention are therefore advantageously distinguished by a high current carrying capacity and the capability for large-scale production, in particular with regard to long conductor lengths.

Advantageous refinements of the composite superconductor according to an embodiment of the invention can be found.

With regard to the risk of current degradation in the composite superconductor according to an embodiment of the invention a bending radius R of at least 150 times the width B and/or a bending zone length H of at least 50 times the width B are/is advantageously provided for the conductor elements.

In principle it is possible to use different conductor elements, for example with and without superconductor material, and/or with different cross sections, for construction of the composite superconductors according to an embodiment of the invention. However, with regard to a uniform current distribution over the entire composite conductor cross section, it is advantageous to provide an assembly formed by conductor elements having the same construction.

Adhesive joints or soldered joints between the conductor elements may be used as the fixing devices for the composite superconductor according to an embodiment of the invention. A binding or braiding is preferably provided, in order to give the composite superconductor sufficient flexibility. In this case, with regard to possible subsequent impregnation with a synthetic resin or with regard to allowing a good coolant supply, the binding or braiding, in particular, be designed to be appropriately transparent or absorbent.

The composite superconductor is advantageously constructed with conductor elements which each have a ratio of their width B to the respective conductor thickness D of between 5 and 40, and preferably of between 10 and 20. Appropriate conductor elements, which are manufactured commercially, are particularly suitable for transposition while maintaining the stated minimum levels.

With regard to reducing the alternating current losses when using composite superconductors according to the invention, they are advantageously constructed with conductor elements of which at least some are electrically insulated from one another.

In consequence, composite superconductors such as these may be used in particular in a power facility which is operated with alternating current, for example in a transformer or in an electrical machine.

For virtually continuous production of a composite superconductor according to the invention, an apparatus is advantageously provided which has means for joining the individual conductor elements from supply spools together, in a pyramid shape, over a bending region and a guide region in a transposition zone, such that the conductor cross-section position remains at least largely constant, for example horizontally, and has a device for transporting the now transposed structure into a take-up spool via a feed unit and a fixing region. The conductor structure is preferably bound or braided in the fixing region. An apparatus such as this advantageously allows the fundamental requirements for HTS transposed conductor production to be satisfied. In particular, it is possible to satisfy the necessity for the very long bending zones, that are typical for HTS, by functional separation and local distribution one behind the other of the steps of "position control", "holding", "bending", "moving" and "joining together" or "combining".

The supply spools for the apparatus can advantageously be mounted on a rotating disk such that they can rotate.

The conductor elements are advantageously supplied to the transposition zone in the apparatus by use of a rotating slotted guide disk. In this case, the transposition zone may advantageously have stationary guide elements and a transposition channel.

BRIEF DESCRIPTION OF THE DRAWINGS

The invention will be explained in more detail in the following text with reference to the drawings. In this case, in each case schematically.

Corresponding parts are provided with the same reference symbols in the figures.

DETAILED DESCRIPTION OF THE PREFERRED EMBODIMENTS

Figure 1:
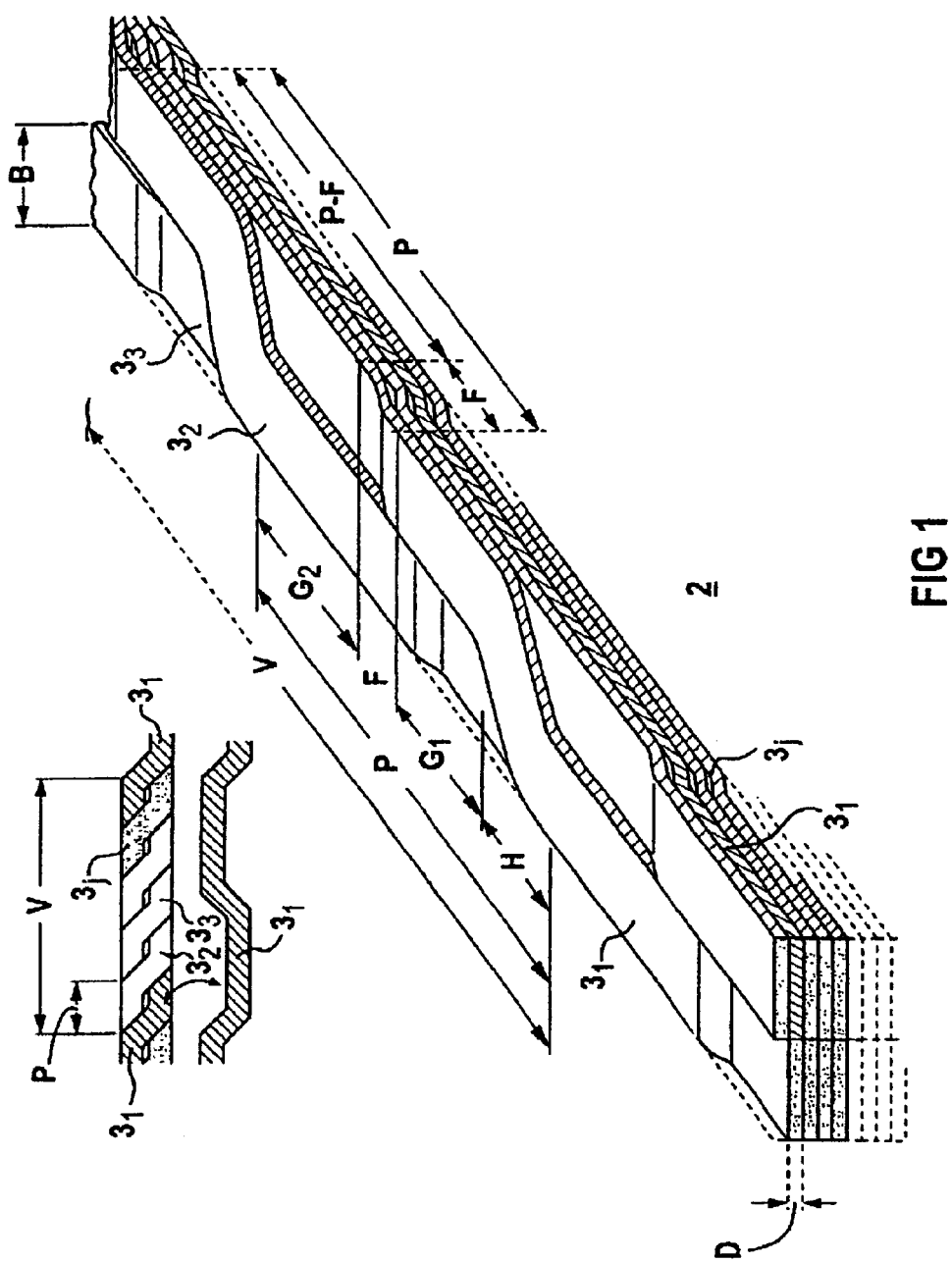
FIG. 1 shows the design of a fully transposed composite semiconductor according to an embodiment of the invention.

FIG. 1 shows an oblique view of a detailed section of a composite superconductor according to an embodiment of the invention, which is annotated in general by 2, based on a known embodiment of such conductors, which contain a number of conductor elements $3_j$ which are joined together in the form of a transposed conductor bar (j=the number of conductor elements where $1 \leq j \leq N$). Reference should be made to DE-C 277 012 as the basis publication relating to transposition. N conductor elements $3_j$ in this case occupy more than N+1 grid locations. The symbols in FIG. 1 have the following meanings:

F flat bending zone
$G_{1,2}$ straight pieces, which are not bent
H on-edge bending zone
P periodic on-edge bending zone separation
V full transposition length
D conductor element thickness
B conductor element width The stated variables are in this case linked to one another as follows:

$P = H + G_1 + F + G_2$ and $V = N \times P$ (where "×" = multiplication symbol).

Figure 2:
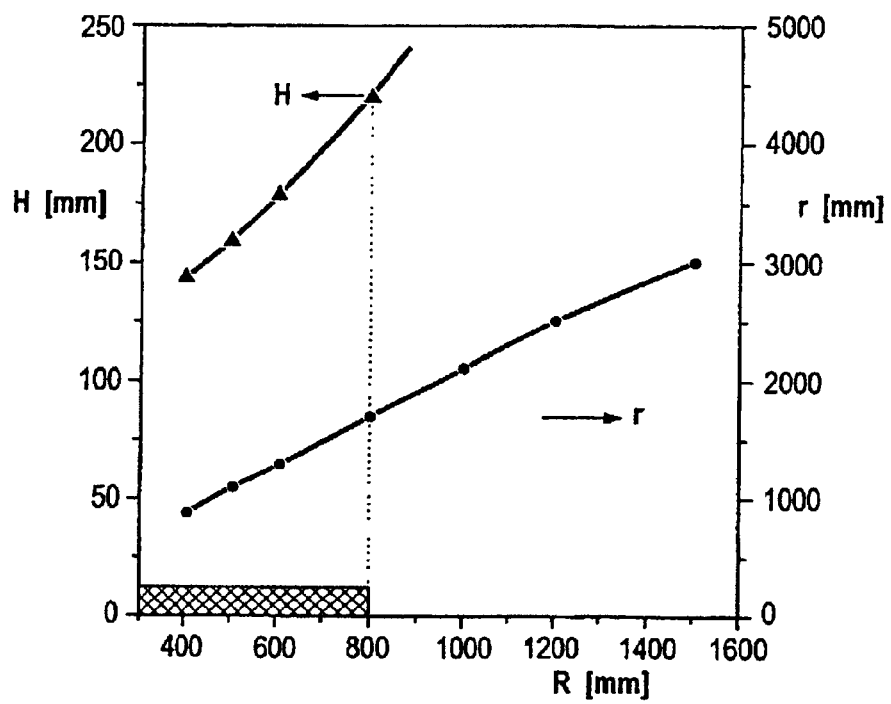
FIG. 2 uses a diagram to show the bending zone length and the remaining bending radius as a function of the bending radius that is used for the production of composite conductors according to an embodiment of the invention.
Figure 3:
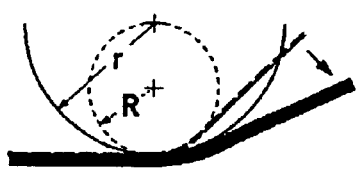
FIGS. 3 and 4 show bending radii for a production on which the diagram in FIG. 2 is based.
Figure 4:
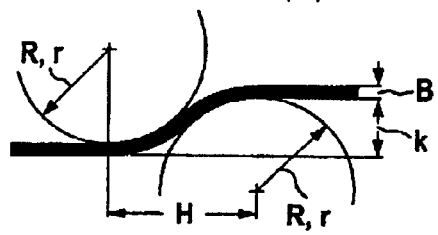

FIG. 1 furthermore shows a plan view of a detail of this composite superconductor 2, as well as a detail of a single conductor element ($3_1$) from this plan view. The conductor elements $3_j$ are known single-core or multi-core HTS conductors in the form of ribbons with a rectangular cross section, with all the conductor elements preferably being of the same design, and each conductor element having the same conductor width B. The conductor elements may, in particular, be known embodiments, which in general have the following features and characteristics:

Geometry and structure: They have small flat cross sections (typically around 1 mm$^2$) and are very thin (typically between 0.2 mm and 0.5 mm; width up to approximately 4 mm). Of the various embodiments that exist, so-called multifilament superconductors (which have a number of superconducting conductor cores) are preferable for use for the application area under consideration: The superconducting ceramic material is embedded, in the form of fine filaments, in a matrix which is composed in particular of silver or a silver alloy. The filaments are in this case preferably twisted (in order to reduce the alternating current losses). The HTS multicomponent compound of the $(Bi,Pb)_2 Sr_2Ca_2Cu_3O_x$ type (so-called (BPSCCO-2223 material") is highly suitable for use as the semiconductor material. The silver matrix can expediently be reinforced by an additional thin sleeve composed, for example, of a silver/magnesium alloy. A corresponding, specific HTS standard ribbon conductor, which is used as the basis of the following explanatory note relating to FIGS. 2 to 4, is known from "IEEE Transactions on Applied Superconductivity", Vol. 9, No. 2, June 1999, Pages 2480 to 2485. This has a silver matrix surrounded by a silver/magnesium sleeve with 55 conductor cores or filaments incorporated in it, which are twisted with one another and are composed of BPSCCO-2223 HTS material. Its external dimensions (without insulation) are 3.6×0.26 mm$^2$. It can also be surrounded by insulation, for example composed of Lupolen, with a thickness of between 0.03 and 0.05 mm.

Mechanical sensitivity to plastic deformation: Maximum permissible edge fiber strains during stretching, bending or torsion are $\leq 0.2\%$, typical bending radii are typically 50 mm (flat side) and 800–1000 mm (on-edge bending).

Anisotropy: The pronounced relationship between its current characteristic and the direction of the magnetic field can be seen. For example, the current which can be transported in 0.3 T and at 77 K falls to approximately one fifth if the field of direction is rotated out of the plane of the conductor into the direction at right angles to the flat conductor face.

The described HTS high-current composite conductor 2 is characterized by the following main features:

1. The composite conductor is composed of a number of preferably fully insulated HTS ribbon conductors as the conductor elements $3_j$. The necessary number N of sub-conductors where the rate of current for a desired rate of current $I_{HTSn}$ in the composite superconductor is not simply the quotient $I_{VLn}/I_{HTSn}$. It is generally considerably greater and, specifically, can be determined only with the aid of material-specific, nonlinear I(B) curves and for a specific application, since $I_{HTSn}$ for a stretched ribbon conductor is defined in the conductor's own field, while, in contrast, $I_{VLn}$ is defined for the local field values at the location where it is used. Even with a stretched composite conductor without any external magnetic field, the field, which is increased by the respective adjacent conductor elements, at the location of each conductor element results in a reduction in its current carrying capacity.

2. The conductor elements $3_j$ are transposed systematically and continuously within the composite conductor overall cross section (principle of a transposed conductor bar: Continuous bends by means of alternating on-edge bends and flat bends).

3. On transpositions, the conductor elements may be subjected to only pure transverse offsets, but—in contrast to twisting—no rotation, torsion or tilting whatsoever. This would leave the alignment of the conductor elements in the worst possible field direction, greatly reducing the current carrying capacity (anisotropy).

4. The conductor element bends which have been referred to are subject to different critical bending radii in the two transverse directions, and these must be determined on a conductor-specific basis for the purposes of the values specified according to the invention. If these values are undershot the current carrying capacity of HTS ribbon conductors that are affected is degraded. The critical radii are in each case approximately 100 times greater than for copper ribbons having the same cross section. The diagram in FIG. 2 shows a critical region for the bending radius R (less than 800 mm) for the known HTS standard ribbon conductor, which is used as a conductor element, with undesirable overstretching of its superconducting conductor filaments and, in consequence, current degradation as indicated by cross shading.—Furthermore, as indicated in FIG. 3, the known HTS conductor strip flexes by a factor of approximately 2 after being bent; that is to say it is necessary to distinguish between the applied bending radius R (applied by the tool) and the permanent, larger bending radius r (in the composite superconductor). Typical values for the actual bending response of the commercial HTS standard ribbon conductor are shown in the diagram in FIG. 2.

5. As is also evident from the diagram in FIG. 2, based on the variables R, r, k (for a lateral, approximately S-shaped bend and H, as defined in FIGS. 3 and 4, the HTS-typical high values for the minimum permissible bending radii R and r are correlated with relatively elongated overflow or bending zones H (=bending zone length with respect to lateral bending in the plane of the conductor element width B) of N conductor elements for the specific HTS standard ribbon conductor used as the basis. This may possibly lead to large bending zone separations P and to large full transposition lengths V=N×P in the composite superconductor, which must be taken into account if the composite conductor has different parameters, for example if the number N is different.

6. The elongated bending zones of the conductor elements which have been addressed in paragraph 5 first of all result in a looser assembly, and considerably problems with compliance with the cross-section tolerances, in the overall conductance. Both of these result in difficulties for winding production. This must be counteracted by suitable fixing, preferably in the form of a external binding or braiding, on or around the structure formed from the individual conductor elements. An external binding is suitable for this purpose if it is applied sufficiently firmly in the interest of tight tolerances, but is at the same time sufficiently loose in order to allow uniform internal compensating movements of the conductor elements in the event of global bending of the composite superconductor, for example during winding production. Absorbent fabric tape should preferably be provided for the external binding, since the subsequent winding will later be impregnated with resin in most applications, in order to achieve the winding stiffness to resist operating and disturbance forces.

7. With regard to the internal compensating movements mentioned above, a high level of smoothness and capability for the insulation surfaces of conductor elements to slide on one another also play a major role—a requirement which must be taken into account by choosing an appropriate insulating material. The incorporation of sliding agents is less advantageous since they adversely affect the insulation characteristics and detract from any resin impregnation which may be carried out later on the complete winding.

Figure 5:
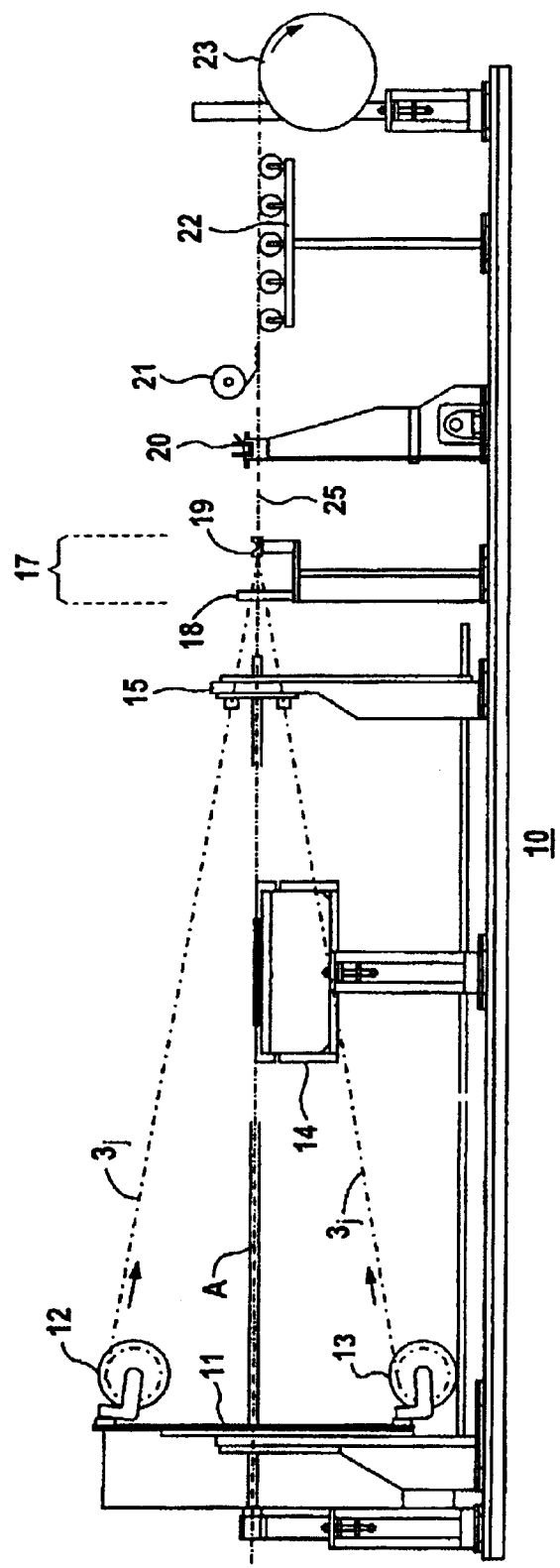
FIG. 5 shows an apparatus for production of this conductor.

The composite semiconductor according to an embodiment of the invention can advantageously be produced using an apparatus as is illustrated schematically in the form of a side view in FIG. 5. This apparatus, which is annotated generally by 10, comprises, in particular, the following parts, namely a large rotating disk 11, which can rotate about an axis A, with supply spools 12 and 13 for conducting elements $3_j$, a double bending tool 14, a rotating slotted guide disk 15, guide elements 18 which are fixed in a transposition zone 17, and a transposition channel 19, a stepping feed unit 20, a binding region 21, a free-running section 22 and a take-up spool 23.

Functions of these parts of the apparatus will be explained in the following text, in the sequence of the horizontal material flow:

1. HTS conductor elements $3_j$, which are in the form of ribbons, are introduced into the process via the individual braked supply spools 12, 13,—that is to say via N supply spools if there are N conductor elements in the subsequent composite superconductor. These are mounted on the large, horizontally mounted (process direction) rotating disk 11 such that in each case oscillate and can rotate, to be precise such that their longitudinal axis always remains transverse with respect to the process direction even when the rotating disk is rotating and the ribbon material is being worn off.

2. With the large rotating disk rotating, the conductor elements $3_j$ are supplied in a pyramid shape (that is to say an imaginary conical envelope surface) to the actual transposition zone 17. In front of this zone, the guide disk 15, which rotates at the same rotating speed and has N individual slotted guides whose transverse axis is always kept horizontal, ensures that the conductor elements are precisely initially aligned for introduction into the transposition zone.

3. Between the large rotating disk 11 and the slotted guide disk 15, bends (so-called "on-edge S bending zones") are produced in the extended, special double bending tool 14—well before the actual transposition process, in contrast to conventional solutions.

4. This is done in a stepping process, to be precise conductor element by conductor element: whenever the over process is stopped, the double tool 14 is moved to a conductor element in the region of the conductor "pyramid" and carries out the bending process, the double tool is withdrawn from the pyramid region again, the large rotating disk—and hence the conductor pyramid—is rotating onward through one pitch (360°/N), the conductor material is drawn onward by one S-zone length H in the conductor longitudinal direction and is held again, the double tool is moved into the region of the next conductor element, and the next bending process is initiated, and so on.

5. The fine adjustment of the position of the present conductor elements—whilst they have passed the slotted guide disk 15 and shortly before they are put together to form a common structure 25—is carried out by a special arrangement of individual stationary guide elements 18, with the aim of transferring the uniform distribution on an imaginary circular path (pyramid cross section) to an endless-bolt-like path distribution and, in the process, furthermore to partially force a phase lead or lag for the conductor elements on the distribution path. This is necessary in order to prepare for the reliable side alternation of the respective uppermost and lowermost conductor elements in the composite conductor cross section.

6. The actual joining together or combination of the present conductor elements $3_j$ whose cross-sectional positions have been pre-aligned, to form the structure 25 of the composite superconductor in this case completed—in time with the stepping process—in the single transposition channel 19. (In conventional system for conventional composite conductors, on the other hand, a number of step elements in the transposition process are locally combined and run continuously: Holding, bending, offsetting, and combination of the conductor elements takes place in a confined space there in a single unit, the so-called "transposition head". The internal dimensions of the channel cross section of this transposition channel 19 correspond approximately to the desired external dimensions of the composite superconductor, and its length is approximately equal to 10 to 20 times the composite conductor width. In the inlet region, all the inlet edges of the channel are slightly round.

7. The stepping feed of the conductor structure 25 comprising its conductor elements is provided by the feed unit 20 (gripping—drawing and longitudinal movement of the structure—opening—moving back without the structure) immediately downstream from the guide channel, interacting with the preset braking force of the supply spools on the rotating disk at the start of the apparatus.

8. An external binding is produced in the binding region 21 of the apparatus—once again in time with the starting process, when at rest, just after the feed unit. Any compromise that is required between looseness and insuring the contour of the conductor assembly can be achieved by means of a specific measure. For example, a conductor stack is temporarily thickened by means of attention strip (with approximately 1.7×the conductor element width, length approximately 1.5×the bending zone separation as shown in FIG. 1), which is placed on the stack at the top and is then wound into the binding, and is subsequently withdrawn once again. In this case, the glass fabric strip is preferably applied as a binding "with gaps" that is say with a gap between the turns of the strip. The extent of looseness in the assembly can be varied by the choice of the strip thickness, the strip separation and the tension force during the binding process. For example, a 6 mm wide tension strip, which can slide and is composed of Hostaphan with a thickness of 0.35 mm, and a fabric tape composed of glass silk with a width of 6 mm and a thickness of 0.1 mm, can in each case be wound with a 9 mm gap to form a binding for a structure 25 of the composite superconductor comprising 13 HTS standard ribbon conductors. The essential features of the described production method can be transferred to mechanical binding processes, as part of an industrial transposition system.

9. Once the composite superconductor 2 has been completely assembled it is supplied via a "free-running section" 22 (e.g. over appropriate rollers) to take-up device 23 at the end of the apparatus 10. The take-up device is set to a constant overall conductor tension, which is the same for forward movement, reverse movement or when at rest. The free-running section is always required in order to compensate for local conductor element displacements in the interior of the assembly, caused by the unavoidable transition of the stretched to the wound (curved) state in a composite conductor. It is known from the production process and winding behavior of conventional transposed conductors that a free-running section such as this must correspond at least to the full transposition length.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fully transposed composite superconductor having an at least approximately rectangular cross section, comprising:
    a plurality of conductor elements, combined in the form of a transposed conductor, each including,
        an at least approximately rectangular cross section with a width,
        at least one conductor core composed of a high $T_c$ superconductor material in at least one of a matrix and sheath composed of normally conductive material,
    with respect to lateral bending in the plane of the width, a predetermined bending radius and a predetermined bending zone length, wherein, for each of the conductor elements,
        the bending radius is greater than 100 times the width, and
        the bending zone length is greater than 20 times the width, and
        the conductor elements are fixed to one another.

2. The composite superconductor as claimed in claim 1, wherein the conductor elements include a bending radius of at least 150 times the width.

3. The composite superconductor as claimed in claim 1, wherein the conductor elements include a bending zone length of at least 50 times the width.

4. The composite superconductor as claimed in claim 1, wherein a combination of conductor elements with the same construction are included.

5. The composite superconductor as claimed in claim 1, wherein the conductor elements are fixed tone another by fixing devices in the form of at least one of adhesive joints and soldered joints between the conductor elements.

6. The composite superconductor as claimed in claim 5, wherein the fixing devices are at least one of bound and braided, the at least one of binding and braiding being at least one of permeable and absorbent for at least one of an impregnation agent and a cooling agent.

7. The composite superconductor as claimed in claim 1, wherein the conductor elements include a ratio of width to the respective conductor thickness of between 5 and 40.

8. The composite superconductor as claimed in claim 1, wherein at least some of its conductor elements are electrically insulated from one another.

9. A power device operated with alternating current, including the composite superconductor as claimed in claim 8.

10. A transformer including the power device of claim 9.

11. The composite superconductor of claim 1, wherein means are provided for fixing the conductor elements to one another.

12. The composite superconductor of claim 1, wherein the conductor elements are fixed to one another by at least one of a binding and braiding.

13. The composite superconductor of claim 11, wherein the fixing means includes at least one of adhesive joints and soldered joints between the conductor elements.

14. The composite superconductor of claim 5, wherein at least some of the conductor elements are fixed to one another by at least one of a binding and braiding.

15. The composite superconductor as claimed in claim 11, wherein the fixing means are at least one of bound and braided, the at least one of binding and braiding being at least one of permeable and absorbent for at least one of an impregnation agent and a cooling agent.

16. The composite superconductor as claimed in claim 1, wherein the conductor elements include a ratio of width to the respective conductor thickness of between 10 and 20.

17. An electrical machine including the power device of claim 9.

* * * * *